United States Patent [19]
Barrow

[11] Patent Number: 5,894,410
[45] Date of Patent: Apr. 13, 1999

[54] PERIMETER MATRIX BALL GRID ARRAY CIRCUIT PACKAGE WITH A POPULATED CENTER

[76] Inventor: Michael Barrow, El Dorado Hills, Calif.

[21] Appl. No.: 08/959,546

[22] Filed: Oct. 24, 1997

Related U.S. Application Data

[63] Continuation of application No. 08/623,355, Mar. 28, 1996.

[51] Int. Cl.$^6$ ............................................. H05K 01/011
[52] U.S. Cl. .................. 361/760; 361/772; 361/777; 361/783; 361/820; 257/778; 257/724; 257/730; 257/780
[58] Field of Search ........................... 361/760, 704, 361/707, 719, 720, 221; 257/700, 747, 778, 787, 723, 724; 228/180.21, 180.22

[56] References Cited

U.S. PATENT DOCUMENTS

| | | | |
|---|---|---|---|
| 5,216,278 | 6/1993 | Lin et al. | 257/688 |
| 5,285,352 | 2/1994 | Pastore et al. | 361/707 |
| 5,355,283 | 10/1994 | Marrs et al. | 361/760 |
| 5,450,283 | 9/1995 | Lin et al. | 361/704 |
| 5,490,324 | 2/1996 | Newman | 29/830 |

*Primary Examiner*—Leo P. Picard
*Assistant Examiner*—David Foster

[57] ABSTRACT

A ball grid array (BGA) integrated circuit package which has an outer two-dimensional array of solder balls and a center two-dimensional array of solder balls located on a bottom surface of a package substrate. The solder balls are typically reflowed to mount the package to a printed circuit board. Mounted to an opposite surface of the substrate is an integrated circuit that is electrically coupled to the solder balls by internal routing within the package. The outer array of solder balls are located the dimensional profile of the integrated circuit to reduce solder stresses induced by the differential thermal expansion between the integrated circuit and the substrate. The center solder balls are typically routed directly to ground and power pads of the package to provide a direct thermal and electrical path from the integrated circuit to the printed circuit board.

29 Claims, 1 Drawing Sheet

PERIMETER MATRIX BALL GRID ARRAY CIRCUIT PACKAGE WITH A POPULATED CENTER

This is a Continuation Application of application Ser. No. 08/623,355, filed Mar. 28, 1996.

BACKGROUND OF THE INVENTION

1. Field of the Invention

The present invention relates to an integrated circuit package.

2. Description of Related Art

Integrated circuits are typically mounted to a package that is soldered to a printed circuit board. One such type of integrated circuit package is a ball grid array ("BGA") package. BGA packages have a plurality of solder balls located on a bottom external surface of a package substrate. The solder balls are reflowed to attach the package to the printed circuit board. The integrated circuit is mounted to a top surface of the package substrate, and electrically coupled to the solder balls by internal routing within the package.

FIG. 1 shows a solder ball array of a prior art BGA package 2. The solder balls 4 are arranged in a two-dimensional pattern across the bottom surface of the package. The integrated circuit 6 is centrally located on the opposite side of the package 2. The package 2 is typically constructed from a material which has a coefficient of thermal expansion that is different than the thermal expansion coefficient of the integrated circuit. It has been found that the differential thermal expansion between the integrated circuit and the package will induce temperature related stresses that fail solder joints in an area which corresponds to the outer edges of the circuit die. FIG. 2 shows a BGA package 2 of the prior art which has an outer two dimensional array of solder balls 4. The solder balls 4 are located away from the package area that is beneath the integrated circuit 6. Locating the solder balls 4 away from the integrated circuit 6 reduces the thermal stresses on the solder joints created by the differential expansion between the package and the integrated circuit. Although effective in reducing solder failure the outer array pattern limits the input/output (I/O) of the package. Additionally, the integrated circuit generates heat which conducts through the solder balls and into the printed circuit board. Locating the solder balls at the outer perimeter of the package increases the thermal path through the package substrate. The longer path increases the thermal impedance of the package and the junction temperature of the integrated circuit. It would be desirable provide a BGA package that has a longer product life, lower thermal impedance and higher I/O than BGA packages of the prior art.

SUMMARY OF THE INVENTION

The present invention is a ball grid array ("BGA") integrated circuit package which has an outer two-dimensional array of solder balls and a center two-dimensional array of solder balls located on a bottom surface of a package substrate. The solder balls are typically reflowed to mount the package to a printed circuit board. Mounted to an opposite surface of the substrate is an integrated circuit that is electrically coupled to the solder balls by internal routing within the package. The outer array of solder balls are located outside the dimensional profile of the integrated circuit to reduce solder stresses induced by the differential thermal expansion between the integrated circuit and the substrate. The center solder balls are typically routed directly to ground and power pads of the package to provide a direct thermal and electrical path from the integrated circuit to the printed circuit board.

BRIEF DESCRIPTION OF THE DRAWINGS

The objects and advantages of the present invention will become more readily apparent to those ordinarily skilled in the art after reviewing the following detailed description and accompanying drawings, wherein.

DETAILED DESCRIPTION OF THE INVENTION

Figure 1:
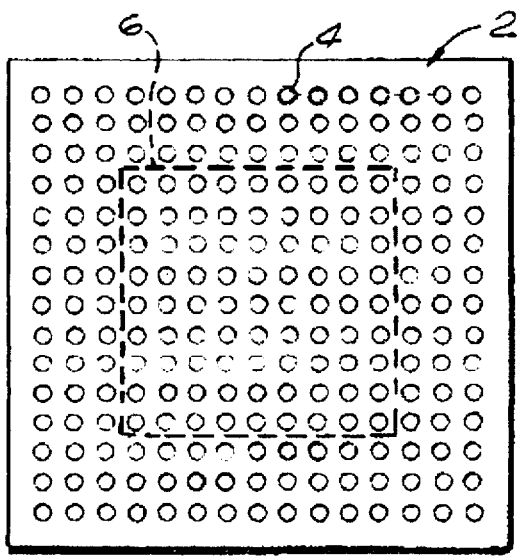
FIG. 1 is a bottom view of a ball grid array integrated circuit package of the prior art.
Figure 2:
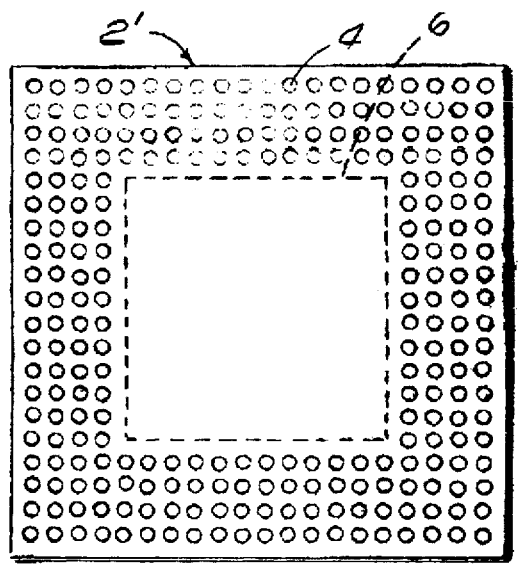
FIG. 2 is a bottom view of a ball grid array integrated circuit package of the prior art.
Figure 3:
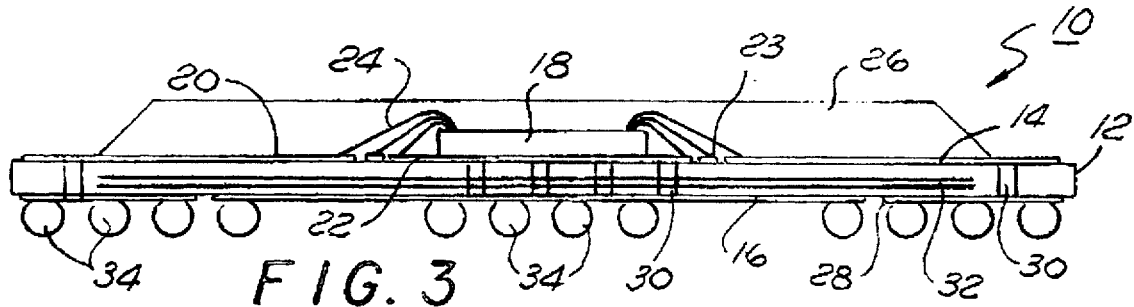
FIG. 3 is a side cross-sectional view of a ball grid array package of the present invention.
Figure 4:
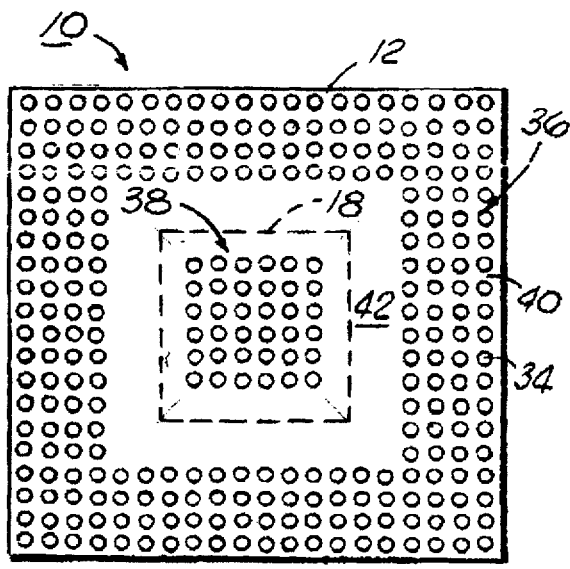
FIG. 4 is a bottom view of the package shown in FIG. 3.

Referring to the drawings more particularly by reference numbers, FIGS. 3 and 4 shows a ball grid array ("BGA") integrated circuit package 10 of the present invention. The package 10 includes a substrate 12 that has a top surface 14 and an opposite bottom surface 16. Mounted to the top surface 14 of the substrate 12 is an integrated circuit 18. The integrated circuit 18 is typically a microprocessor. Although a microprocessor is described, it is to be understood that the package 10 may contain any electrical device(s).

The top surface 14 of the substrate 12 has a plurality of bond pads 20 and a ground bus 22. The substrate 12 may also have a separate power bus 23 concentrically located about the integrated circuit 18 and ground pad 22. The integrated circuit 18 is coupled to the bond pads 20 and busses 22 and 23 by bond wires 24. The integrated circuit 16 is typically enclosed by an encapsulant 26. Although bond wires 24 are shown and described, the integrated circuit 18 can be mounted and coupled to the substrate with solder balls located on the bottom surface of the circuit die in a package and process commonly referred to as "C4" or "flip chip" packaging.

The bottom surface 16 of the substrate 12 has a plurality of contact pads 28. The contact pads 28 are coupled to the bond pads 20 and busses 22 and 23 by vias 30 and internal routing 32 within the substrate 12. The substrate can be constructed with conventional printed circuit board, or co-fired ceramic, packaging processes known in the art.

A plurality of solder balls 34 are attached to the contact pads 28 with known ball grid array processes. The solder balls 34 are typically reflowed to attach the package to a printed circuit board (not shown).

The contact pads 28 are arranged in an outer two-dimensional array 36 and a center two-dimensional array 38. Each array contains a plurality of contact pads 28 that are separated from each other by a number of dielectric spaces 40. The outer array 36 is separated from the center array 38 by a dielectric area 42. The outer array 36 is preferably located outside of the outer dimensional profile of the integrated circuit 18. In this manner the solder joints of the outer array 36 are not subjected to stresses created by the difference in the coefficient of thermal expansion of the integrated circuit 18 and the expansion coefficient of the substrate 12. The center array 38 is located near the origin of the integrated circuit 18 in an area that does not undergo as much thermal expansion as the outer edges of the circuit die. Therefore the solder stresses created by the differential thermal expansion is minimal in the area of the center array 38. The separated arrays provide a pattern that minimizes the stresses on the solder joints.

The outer array 36 is typically coupled to the signal lines of the integrated circuit 18. The center array 38 is preferably coupled to the ground bus 20 and power bus 23 of the substrate 12. The vias 30 that couple the busses 22 and 23 to the center contact pads 38 provide a direct thermal path through the substrate. The direct path lowers the thermal impedance of the package 10 and the junction temperature of the integrated circuit 18. Additionally, the short electrical path lowers the self-inductance and reduces the switching noise of the integrated circuit 18.

In the preferred embodiment, the package 10 contains 292 contact pads 28 on a 27 by 27 millimeter (mm) wide substrate 12, or 352 contact pads 28 on a 35 by 35 mm substrate 12. The dielectric space 40 between the contact pads 28 is typically 1.27 mm. The package 10 typically has a height of approximately 2.5 mm.

The package 10 is assembled by attaching the solder balls 34 to the contact pads 28. The integrated circuit 18 is mounted and coupled to the substrate 12. The integrated circuit 18 is then enclosed by the encapsulant 26. The BGA package 10 is typically shipped to an end user that mounts the package 10 to a printed circuit board by reflowing the solder balls 34.

Figure 5:
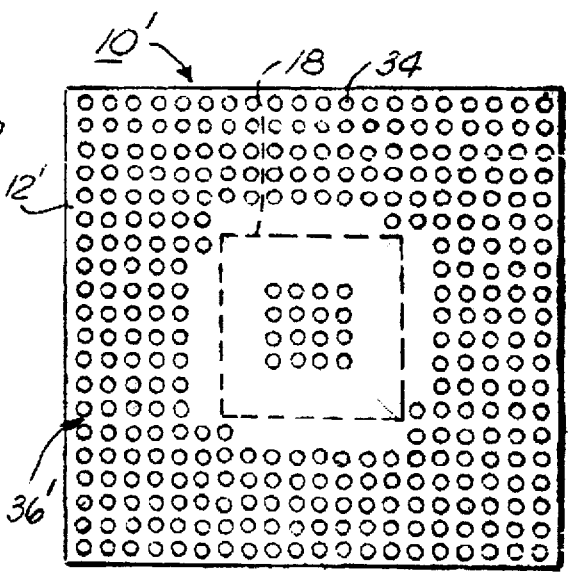
FIG. 5 is a bottom view of an alternate ball grid array package.

FIG. 5 shows an alternate embodiment of a package 10' which has five or six rows of contact pads 28 in the outer array 36' of the substrate 12'. The additional pads 28 increase the input/output (I/O) of the package 10. The outer array 36' is preferably outside the outer dimensional profile of the integrated circuit 18 to minimize the stresses on the solder joints. The package 10' may provide 324 contact pads 28 on a 27 by 27 mm substrate 10. The longer rows of the package 60 provide the approximate I/O of a 35 by 35 mm package, within the footprint of a 27 by 27 mm package.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A ball grid array package, comprising:
a substrate which has a top surface and an exposed external bottom surface, said external bottom surface consisting only of an outer array of contact pads each separated from each other by a first distance, and a center array of contact pads each separated from each other by a second distance, said center array of contact pads being separated from said outer array of contact pads by a third distance which is larger than the first and second distances; and,
a plurality of solder balls attached to said contact pads of said substrate.

2. The package as recited in claim 1, wherein said top surface of said substrate has a plurality of bond pads.

3. The package as recited in claim 2, wherein said top surface of said substrate has a ground bus that is connected to said center array of contact pads by a plurality of vias that extend through said substrate.

4. The package as recited in claim 3, wherein said outer array of contact pads has at least five rows of contact pads.

5. The package as recited in claim 4, wherein said top surface of said substrate has a power bus that is connected to said center array of contact pads by a plurality of vias that extend through said substrate.

6. The package as recited in claim 5, wherein said center array of contact pads is arranged in a four by four matrix.

7. A ball grid array integrated circuit package, comprising:
a substrate which has a top surface and an exposed external bottom surface, said top surface having a plurality of bond pads, said external bottom surface consisting only of an outer array of contact pads each separated from each other by a first distance, and a center array of contact pads each separated from each other by a second distance, said center array of contact pads being separated from said outer array of contact pads by a third distance which is larger than the first and second distances;
a plurality of solder balls attached to said contact pads of said substrate; and,
an integrated circuit that is mounted to said substrate and coupled to said bond pads.

8. The package as recited in claim 7, wherein said top surface of said substrate has a ground bus that is coupled to said integrated circuit and connected to said center array of contact pads by a plurality of vias that extend through said substrate.

9. The package as recited in claim 8, wherein said outer array of contact pads has at least five rows of contact pads.

10. The package as recited in claim 9, wherein said top surface of said substrate has a power bus that is connected to said center array of contact pads by a plurality of vias that extend through said substrate.

11. The package as recited in claim 10, wherein said center array of contact pads is arranged in a four by four matrix.

12. The package as recited in claim 11, wherein said integrated circuit is enclosed by an encapsulant.

13. The package as recited in claim 7, wherein said outer array of contact pads is located outside an outer dimensional profile of said integrated circuit.

14. A method for assembling a ball grid array integrated circuit package, comprising the steps of:
a) providing a substrate which has a top surface and an exposed external bottom surface, said external bottom surface consisting only of an outer array of contact pads each separated from each other by a first distance, and a center array of contact pads each separated from each other by a second distance, said center array of contact pads being separated from said outer array of contact pads by a third distance which is larger than the first and second distances;
b) mounting an integrated circuit to said top surface of said substrate; and,
c) attaching a plurality of said solder balls to said contact pads.

15. The method as recited in claim 14, further comprising the step of encapsulating said integrated circuit.

16. The method as recited in claim 15, further comprising the step of coupling said integrated circuit to said substrate with a plurality of bond wires.

17. An integrated circuit package for an integrated circuit which has a dimensional profile, comprising:
a substrate which has a top surface and an exposed external bottom surface, said external bottom surface consisting only of an outer array of contact pads located outside the dimensional profile of the integrated circuit and a center array of contact pads located within the dimensional profile of the integrated circuit, wherein said outer array is separated from said center array by a distance that is greater than a distance which separates said contact pads from each other.

18. The package as recited in claim 17, wherein said top surface of said substrate has a plurality of bond pads.

19. The package as recited in claim 18, wherein said top surface of said substrate has a ground bus that is connected to said center array of contact pads by a plurality of vias that extend through said substrate.

20. The package as recited in claim 19, wherein said outer array of contact pads has at least five rows of contact pads.

21. The package as recited in claim 20, wherein said top surface of said substrate has a power bus that is connected to said center array of contact pads by a plurality of vias that extend through said substrate.

22. The package as recited in claim 21, wherein said center array of contact pads is arranged in a four by four matrix.

23. The package as recited in claim 1, wherein the first distance is the same as the second distance.

24. The package as recited in claim 7, wherein the first distance is the same as the second distance.

25. The package as recited in claim 17, further comprising a plurality of solder balls that are attached to said contact pads.

26. A ball grid array package, comprising:
   a substrate which has a top surface and an opposite exposed external bottom surface; and,
   a plurality of solder balls attached to said external bottom surface of said substrate, said solder balls consisting only of an outer array of solder balls each separated from each other by a first distance, and a center array of solder balls each separated from each other by a second distance, said center array of solder balls being separated from said outer array of solder balls by a third distance which is larger than the first and second distances.

27. The package as recited in claim 26, wherein the first distance is equal to the second distance.

28. An integrated circuit package for an integrated circuit which has a dimensional profile, comprising:
   a substrate which has a top surface and an exposed external bottom surface;
   a plurality of solder balls that are attached to said external bottom surface, said solder balls consisting only of an outer array of solder balls located outside the dimensional profile of the integrated circuit and a center array of solder balls located within the dimensional profile of the integrated circuit, wherein said outer array is separated from said center array by a distance that is greater than a distance which separates said solder balls from each other.

29. The package as recited in claim 28, wherein the first distance is equal to the second distance.

* * * * *

UNITED STATES PATENT AND TRADEMARK OFFICE
CERTIFICATE OF CORRECTION

PATENT NO : 5,894,410
DATED : April 13, 1999
INVENTOR(S): Michael Barrow

It is certified that error appears in the above-identified patent and that said Letters Patent is hereby corrected as shown below:

In the title page after "[76] Inventor: Michael Barrow, El Dorado Hills, Calif.", please insert item --

[73] Assignee: Intel Corporation, Santa Clara, Calif. --

Title page, item [57], abstract, insert the following:
--Attorney, Agent of Firm-Blakely Sokoloff Taylor & Zafman--.

Signed and Sealed this

Twenty-sixth Day of October, 1999

*Attest:*

Q. TODD DICKINSON

*Attesting Officer*  *Acting Commissioner of Patents and Trademarks*

UNITED STATES PATENT AND TRADEMARK OFFICE
CERTIFICATE OF CORRECTION

| | |
|---|---|
| PATENT NO. | : 5,894,410 |
| APPLICATION NO. | : 08/959546 |
| DATED | : April 13, 1999 |
| INVENTOR(S) | : Michael Barrow |

Page 1 of 1

It is certified that error appears in the above-identified patent and that said Letters Patent is hereby corrected as shown below:

In column 4, at line 55 before "solder", delete "said".

Signed and Sealed this

Twenty-sixth Day of June, 2007

JON W. DUDAS
*Director of the United States Patent and Trademark Office*